(12) United States Patent
Fiori, Jr.

(10) Patent No.: US 10,856,452 B1
(45) Date of Patent: Dec. 1, 2020

(54) SENSOR APPARATUS

(71) Applicant: David Fiori, Jr., Yardley, PA (US)

(72) Inventor: David Fiori, Jr., Yardley, PA (US)

( * ) Notice: Subject to any disclaimer, the term of this patent is extended or adjusted under 35 U.S.C. 154(b) by 1312 days.

(21) Appl. No.: 13/830,223

(22) Filed: Mar. 14, 2013

(51) Int. Cl.
*G01B 7/14* (2006.01)
*H05K 9/00* (2006.01)

(52) U.S. Cl.
CPC *H05K 9/00* (2013.01); *G01B 7/14* (2013.01)

(58) Field of Classification Search
CPC .. G01D 5/2046; G01D 5/2086; G01D 5/2053; G01D 5/2033; G01D 5/2013; G01D 11/245; G01B 7/14; G01B 7/003; G01B 7/30; H05K 9/00; G01P 3/488; G01P 1/026
USPC ............ 324/207.15, 207.17, 207.16, 207.13, 324/207.22, 207.11, 239, 257, 269, 260; 73/488, 514.31, 1.79; 340/941
See application file for complete search history.

(56) References Cited

U.S. PATENT DOCUMENTS

| | | | | |
|---|---|---|---|---|
| 3,483,458 A | * | 12/1969 | Kirk ........................ | B60L 50/52 318/400.37 |
| 3,777,255 A | * | 12/1973 | Young .................. | G01D 5/2033 324/207.17 |
| 4,401,986 A | * | 8/1983 | Trenkler ................ | G01D 5/204 324/207.15 |
| 4,507,639 A | * | 3/1985 | Trenkler ................ | G01D 5/204 336/115 |
| 4,841,245 A | * | 6/1989 | Fiori, Jr. ................ | G01D 5/243 324/207.17 |
| 4,851,770 A | * | 7/1989 | Fiori, Jr. ................ | G01D 5/243 324/207.16 |
| 4,926,111 A | * | 5/1990 | Lungu ...................... | H01F 5/00 323/355 |
| 5,003,260 A | * | 3/1991 | Auchterlonie ........... | G01B 7/14 324/207.16 |
| 5,043,661 A | * | 8/1991 | Dubey .................. | G01B 7/023 324/207.12 |
| 5,453,685 A | * | 9/1995 | Gould .................... | G01B 7/003 324/207.16 |

(Continued)

FOREIGN PATENT DOCUMENTS

| | | | | |
|---|---|---|---|---|
| CN | 101393060 A | * | 3/2009 | ............... G01L 5/00 |
| DE | 10044839 A1 | * | 4/2001 | ............. G01B 7/003 |

(Continued)

*Primary Examiner* — Patrick Assouad
*Assistant Examiner* — Sean Curtis

(57) ABSTRACT

A shield for an inductive position sensor is configured in shape to avoid compromising the inductive field variations related to the sensor's moving target. Said shield is shaped as at least one conductive strip and is laid along the direction of motion of the moving target. Said shield is arranged to prevent induced current in the shield that could affect the part of the inductive field used by the sensor. Improvements are also conferred by a demodulator circuit implementing a zero phase oscillator which simultaneously measures the inductance and the temperature of the sensor windings to reduce and compensate for the effects of the shield. Said conductive shield may also provide for the electrical connection to the far end of the winding. For multi-layer windings, connection of the winding closest to the shield to the lower impedance side of the demodulator also reduces the effect of the shield.

22 Claims, 14 Drawing Sheets

(56) References Cited

U.S. PATENT DOCUMENTS

| | | | | |
|---|---|---|---|---|
| 5,504,427 A * | 4/1996 | Cooper | G01B 7/30 | 324/207.13 |
| 5,617,023 A * | 4/1997 | Skalski | G01B 7/14 | 324/207.17 |
| 5,680,201 A * | 10/1997 | Veronesi | G01B 7/003 | 324/207.16 |
| 5,854,553 A * | 12/1998 | Barclay | G01G 7/14 | 324/207.16 |
| 5,952,822 A * | 9/1999 | Kayserman | G01B 7/003 | 324/207.12 |
| 6,034,624 A * | 3/2000 | Goto | G01B 7/02 | 324/207.16 |
| 6,043,644 A * | 3/2000 | de Coulon | G01D 5/2208 | 324/164 |
| 6,084,401 A * | 7/2000 | Palma | G01D 5/2515 | 324/207.21 |
| 6,124,708 A * | 9/2000 | Dames | G01D 5/2053 | 324/207.12 |
| 6,249,234 B1 * | 6/2001 | Ely | G01D 5/2073 | 178/18.06 |
| 6,561,022 B1 * | 5/2003 | Doyle | A47J 31/4457 | 324/207.15 |
| 6,566,862 B1 * | 5/2003 | Goto | G01D 3/0365 | 324/207.16 |
| 6,593,730 B2 * | 7/2003 | Zapf | G01D 5/2275 | 324/207.17 |
| 6,642,711 B2 * | 11/2003 | Kawate | G01B 7/003 | 324/207.17 |
| 6,670,804 B1 * | 12/2003 | Glemser | B62D 15/02 | 324/207.16 |
| 6,747,448 B2 * | 6/2004 | Berndt | G01D 5/2073 | 324/207.15 |
| 6,838,873 B2 * | 1/2005 | James | D06F 39/003 | 324/207.16 |
| 6,853,183 B2 * | 2/2005 | Kindler | G01B 7/003 | 324/207.17 |
| 6,861,848 B2 * | 3/2005 | Kasai | G01D 5/24 | 324/658 |
| 7,030,782 B2 * | 4/2006 | Ely | G01D 5/2073 | 178/18.07 |
| 7,161,348 B2 * | 1/2007 | Luber | G01D 5/202 | 324/207.24 |
| 7,216,054 B1 * | 5/2007 | Pchelnikov | G01P 3/64 | 324/207.16 |
| 7,276,897 B2 * | 10/2007 | Lee | G01D 5/2053 | 324/207.17 |
| 7,292,026 B2 * | 11/2007 | Lee | F02D 11/106 | 324/207.17 |
| 7,443,159 B2 * | 10/2008 | Habenschaden | G01D 5/2013 | 324/207.15 |
| 7,449,878 B2 * | 11/2008 | Lee | G01D 5/2258 | 324/207.23 |
| 7,705,585 B2 * | 4/2010 | Howard | G01D 5/2053 | 324/207.17 |
| 7,994,778 B2 * | 8/2011 | Kirchdoerffer | G01D 5/2053 | 324/207.12 |
| 8,020,453 B2 * | 9/2011 | Kreit | G01D 5/2073 | 73/862.331 |
| 8,188,730 B2 * | 5/2012 | Gong | H03K 17/9502 | 324/207.11 |
| 8,350,561 B2 * | 1/2013 | Lee | G01D 5/2258 | 324/207.24 |
| 8,421,446 B2 * | 4/2013 | Straubinger | G01D 5/2225 | 324/207.15 |
| 8,564,281 B2 * | 10/2013 | Filatov | G01B 7/003 | 324/207.17 |
| 8,570,028 B2 * | 10/2013 | Ely | G01D 5/208 | 324/207.11 |
| 8,742,715 B2 * | 6/2014 | Ortman | G01D 5/2073 | 318/660 |
| 9,441,992 B2 * | 9/2016 | Matsumoto | G01F 1/582 | |
| 10,054,466 B2 * | 8/2018 | Matsumoto | H05K 13/00 | |
| 2003/0062889 A1 * | 4/2003 | Ely | G01D 5/2073 | 324/207.17 |
| 2003/0169033 A1 * | 9/2003 | Tromblee | B60N 2/002 | 324/207.2 |
| 2005/0030010 A1 * | 2/2005 | Jones | D06F 39/003 | 324/207.24 |
| 2005/0253576 A1 * | 11/2005 | Nyce | G01D 5/2216 | 324/207.17 |
| 2006/0017430 A1 * | 1/2006 | Hagan | G01D 5/145 | 324/207.2 |
| 2006/0132120 A1 * | 6/2006 | Luber | G01D 5/2006 | 324/207.16 |
| 2006/0290346 A1 * | 12/2006 | Habenschaden | G01D 5/2013 | 324/207.16 |
| 2008/0054887 A1 * | 3/2008 | Lee | G01D 5/2053 | 324/207.17 |
| 2009/0102463 A1 * | 4/2009 | May | G01D 5/2013 | 324/207.16 |
| 2010/0001718 A1 * | 1/2010 | Howard | G01B 7/003 | 324/207.15 |
| 2010/0156402 A1 * | 6/2010 | Straubinger | G01D 5/202 | 324/207.25 |
| 2010/0194385 A1 * | 8/2010 | Ronnat | B62D 1/00 | 324/207.25 |
| 2010/0301840 A1 * | 12/2010 | Filatov | G01B 7/003 | 324/207.11 |
| 2012/0007591 A1 * | 1/2012 | Howard | G01B 7/003 | 324/207.15 |
| 2014/0117980 A1 * | 5/2014 | Ely | G01D 5/2046 | 324/207.17 |
| 2015/0022190 A1 * | 1/2015 | Taylor | H03B 7/06 | 324/207.15 |
| 2017/0057051 A1 * | 3/2017 | Nakamura | B24B 49/105 | |
| 2019/0225099 A1 * | 7/2019 | Sieber | B60L 53/12 | |

FOREIGN PATENT DOCUMENTS

| | | | | |
|---|---|---|---|---|
| DE | 10044839 A1 * | 4/2001 | | G01B 7/003 |
| DE | 10044839 B4 * | 4/2004 | | G01B 7/003 |
| EP | 1965177 A * | 9/2008 | | G01D 5/20 |
| EP | 1965177 A1 * | 9/2008 | | G01D 5/2046 |
| EP | 1965177 A1 * | 9/2008 | | G01D 5/2046 |
| WO | WO 01/92817 A1 * | 12/2001 | | |
| WO | WO 0192817 A1 * | 12/2001 | | G01B 7/14 |

* cited by examiner

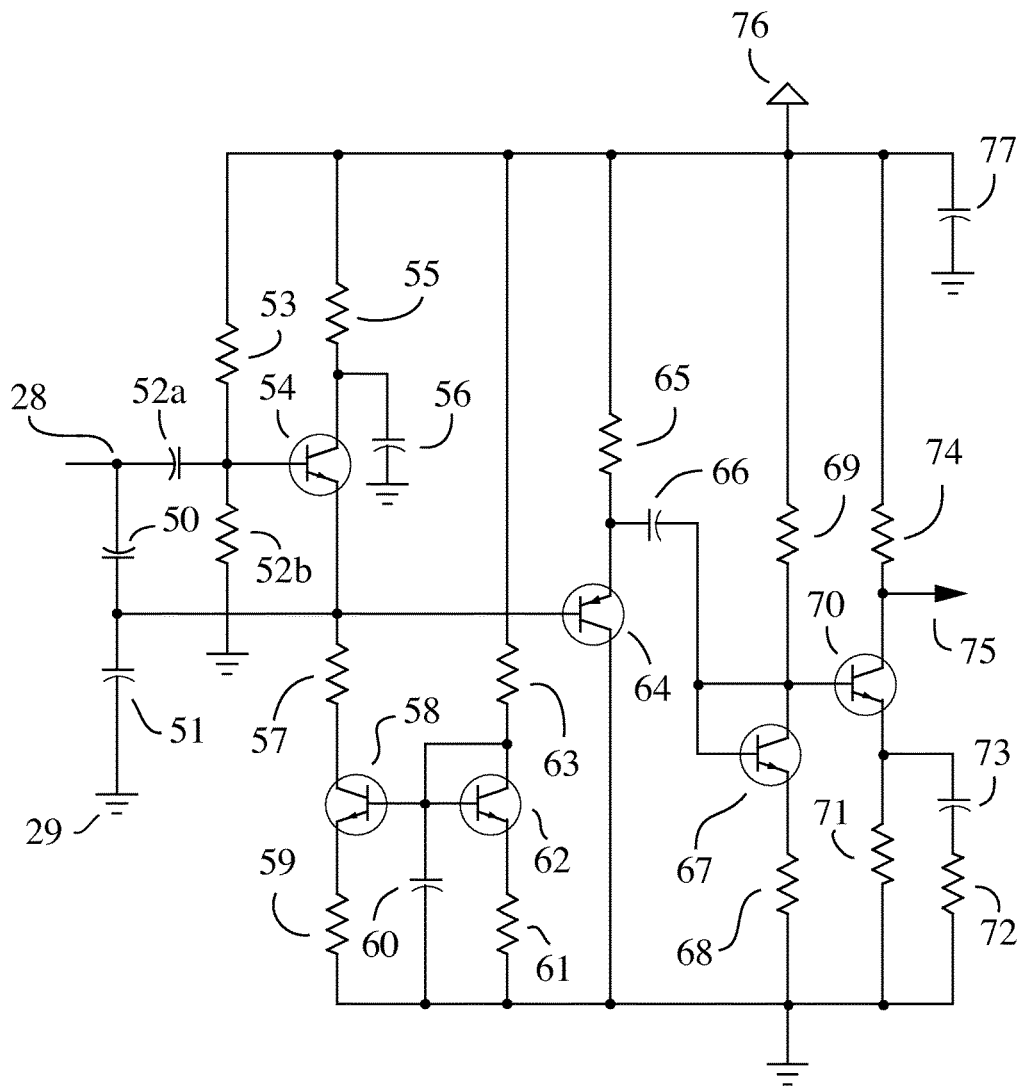
Fig. 16 - Preferred Emboidiment
Oscillator

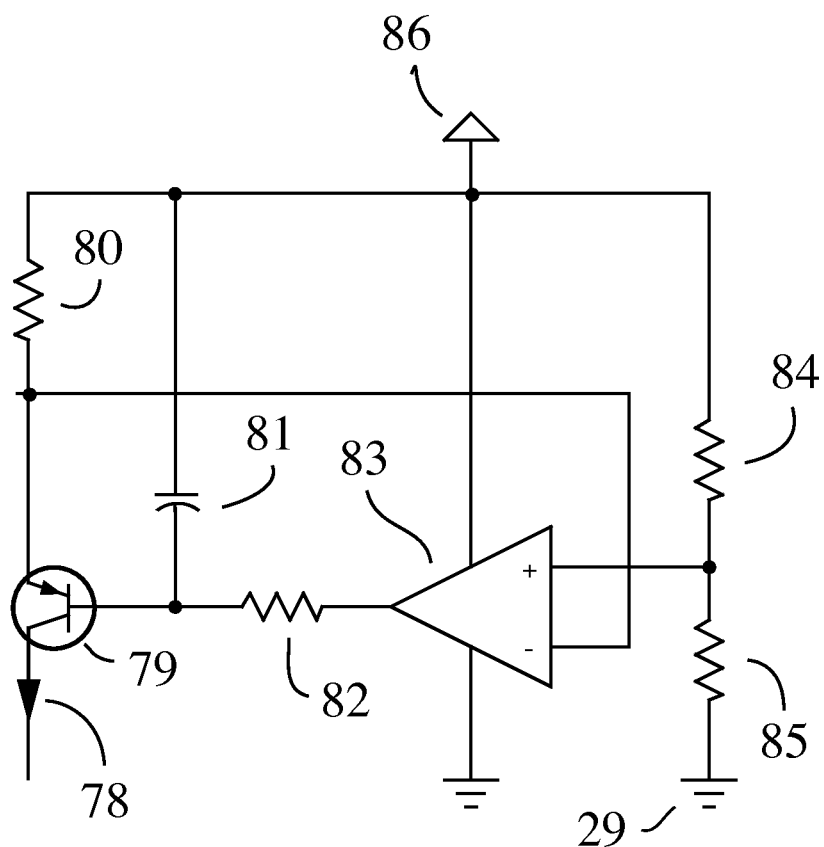
Fig. 17 - Preferred Emboidiment
Constant Current Source

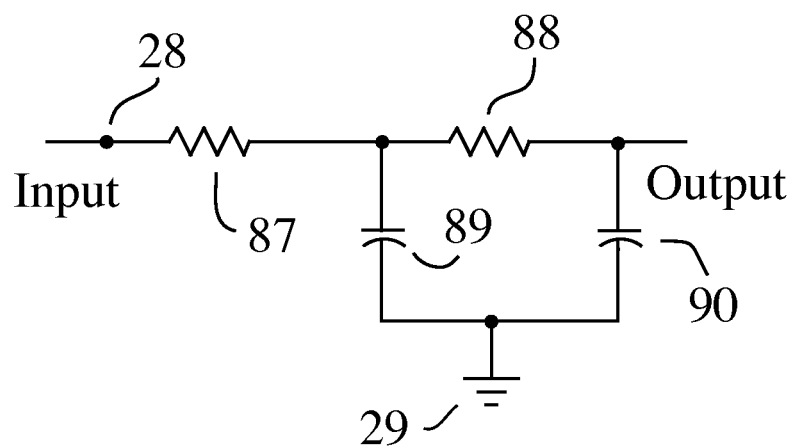
Fig. 18 - Preferred Emboidiment
Low Pass Filter

SENSOR APPARATUS

FIELD OF THE INVENTION

The present invention relates, in general, to inductive non-contacting position sensors. This invention is concerned particularly with improvements to the physical sensor and in the measurement of certain physical sensor characteristics that can improve the measurement accuracy of the position of a moving part.

BACKGROUND OF THE INVENTION

Non-contacting inductive sensors are well-known. Such sensors may include one or more stationary inductance coils and a movable member which moves in the field of the stationary inductance coils in accordance with the parameter being monitored to change the induction of the stationary coils. Non-contacting sensors are especially useful because they are not subject to wear as are those sensors in which the moving and stationary parts are in contact. For example, in a simple potentiometer having a wiper blade which moves along a resistance winding, the constant moving, frictional contact between the wiper blade and the resistance winding will cause wear of one or both parts and so limit the useful lifetime of the apparatus.

In general, non-contacting inductive position sensors based only on magnetic field effects are desirable in that few real world environmental effects, such as interposing fluids, dust, or humidity significantly affect such position sensors.

Inductive sensors can also be very simple in construction and therefore achieve high levels of reliability. Comprised primarily of a single length of wire wound on a form or patterned as conductors printed or etched on suitable insulating substrates such sensors can be very simple and low in cost. Such sensors are inherently impervious to extremes in environmental conditions such as temperature, humidity, and vibration because of their simple construction.

Moreover, there are advantages in exciting such inductive sensors with higher frequencies of electrical excitation in the course of developing an electrical signal indicative of the position of the sensor's target. The advantages of operating inductive sensors at higher frequencies can include lower operation power requirements, lower cost of manufacture, greater immunity to interference, and greater precision of demodulation. This is so because the reactive impedance of the inductor increases in direct proportion to the frequency of operation. Accordingly, higher frequencies of electrical excitation correspond to a larger signal in relation to the power applied to the sensor. This results in a higher potential level across the sensor for a given level of power consumption. With higher frequencies of operation higher levels of sensor signal are better able to rise above any induced interference, while the larger signals subdue various undesirable effects of the demodulating electronics. Exciting the sensors at higher frequencies will also contribute to providing position indications with greater speed of response because the signal's information occurs at a higher repetition rate. Last, but not least, higher frequency of operation makes sensors with fewer turns of wire practical. Wire and winding time costs are therefore reduced while encouraging applications where size and weight are important factors.

In addition, such inductive position can be operated in connection with a capacitor whereas the resonance of the inductance of the sensor and the capacitance in the circuit together determine the behavior of the circuit. Such so called resonant circuits offer additional benefits including the operation of the sensor at much lower power levels than would be possible without such a connection.

Unfortunately, higher frequencies of operation, and the employment of resonant circuits increase the sensitivity of such a sensor circuit to the undesirable capacitive coupling between the sensor target, the inductive windings, and other features of the sensor and its environment.

Because the effect of such capacitive couplings interact with the electrical properties of the inductive sensor in a myriad of unpredictable ways, such effects are very undesirable and substantially limit the practical implementation of an accurate non-contacting position sensor.

This is true because the influence of these extraneous capacitive couplings increases and is directly proportional to the operating frequency. This effect therefore works against the advantages of exciting the sensor at higher frequencies and places a limit on how high an excitation frequency is practical for a given level of accuracy.

For example, capacitive coupling can be a severe problem when the sensor is immersed in fluids which have high electric field permittivity or which are conductive enough to couple unwanted impedance variations which are then capacitively coupled via high frequency electric fields into the sensor element. Because these effects are generally very temperature sensitive and typically vary as a function of the position of the target, these effects are nearly impossible to predict or compensate for, and make it more difficult if not impossible to realize a practical and accurate sensor that operates at high frequencies. To reduce these problems with the prior art the sensor must be excited with a lower frequency and wound with more turns of wire and so the potential advantages of operating at higher frequencies are limited in the prior art.

Inductive sensors operating at high frequencies are also plagued by their ability to generate, and their susceptibility to electro-magnetic interference (EMI). At high enough frequencies such sensors can behave as very good radio frequency antennas. Susceptibility and emission of RF fields by such a sensor are undesirable side effects of operating inductive sensors at high frequencies, especially when the frequencies of operation approach those frequencies used for radio communications. Such EMI concerns can also limit the practical excitation frequency for such sensors.

Another limitation of inductive position sensors is the sensitivity of the sensor position function to temperature variation. In general, materials that effect the magnetic field distribution as a function of position do so with some sensitivity to temperature. In particular eddy current sensors exhibit substantial temperature variations that are a strong function of the target position whereas variations in temperature create errors in the position function the magnitude of which are a strong function of the coupling of the eddy current coupled target whose position is measured by the sensor.

PRIOR ART

U.S. Pat. No. 3,851,242 to Ellis describes improvements to a linear inductive eddy current position sensor system. Like the preferred embodiment of this invention, the Ellis device was based on the variation in sensor inductance effects by eddy currents in a conductive moving target. Again like the preferred embodiment in this disclosure, the Ellis device converts such changes in inductance to an oscillation period. Unlike the preferred embodiment in this disclosure, the sensor Ellis described had no electric field shielding.

U.S. Pat. No. 4,841,245 to this inventor also describes a planar rotary position sensor based on the variation of the inductance of a pair of planar printed circuit coils as a function of the rotary position of a conductive rotor element. The sensor divulged in that patent had no electric field shielding, but is, nevertheless, indicative of the state of the art in high frequency magnetic field based rotary sensors. This rotary position sensor employed two inductive sensor coils arranged differentially and taught circuits for multiplexing and demodulating the two sensor coils in timed alternating sequence. Although the ratiometric differential metric developed by that system is very effective in correcting for temperature effects inherent in the system components, yet further improvement is possible with the invention described herein.

IEEE JOURNAL OF SOLID-STATE CIRCUITS, VOL. 33, NO. 5, May 1998 article entitled "On-Chip Spiral Inductors with Patterned Ground Shields for Si-Based RF IC's" by C. Patrick Yue describes a shield designed to ameliorate the effects of electric fields on the characteristics of an inductor. Although not applied to a position sensor specifically, the inductor so improved could be used with appropriate electronic demodulation technology to develop a position indication of a suitable moving part. However, the shield described would introduce variations in electric field distributions as a function of any target motion parallel to the axis of the coil element because the shield separations will introduce non-linear variations in residual capacitive coupling which would compromise the monotonicity of a high resolution position function.

U.S. Pat. No. 3,662,255 to Garrett describes an improved metal detector with a shield which is essentially a large proximity sensor based on the variation in inductance in a large planar coil winding. The patent describes an electric field shield which surrounds the inductive coil and is coaxial with the conductors responsible for generating the magnetic field upon which the sensor relies for its operation. The invention describes only one connection to the electric shield so that without a low impedance pathway, the shield cannot conduct any current as a function of induced potentials in the shield, and so, like the invention described here, does not substantially alter the magnetic field created by the sensing coil. The shield described in that invention, disposed to be coaxial with the inductive winding's wire along the entire length of the winding is nevertheless problematic because the shield itself is a conductor wound along the same path and in close proximity to the sensor winding conductor, and like the sensor winding, includes a self inductance property. Thus, the shield inductance is substantially equal to the sensor inductance and is also highly coupled both inductively and capacitively to the sensor winding. The inductance of this shield interacts with the capacitance between the shield and the sensor conductor and the capacitance of the sensor circuits that can result in substantial position function non-linearities due to spurious resonances which severely limit the usefulness of such a construction for a position or proximity measuring device. Such spurious resonances are a practical matter unpredictable, create large differential non-linearity errors, and vary with temperature in complex ways that cannot be compensated in any practical way.

U.S. Pat. No. 8,020,453 to Kreit claims an inductive sensor based on the variation in level of the inductively coupled RF energy from a transmitting antenna coil to a receiver coil as a function of the mechanical position of an intervening moving coil. The position of this moving coil is determined by the overall inductive coupling between a set of two inductively coupled regions; first between the intermediate coil and the antenna coil, and then between the intermediate coil and the receive coil. Kreit also teaches a temperature compensation method based on the measurement of the resistance of the transmitting antenna coil of the device. Measurement of the system temperature by such an antenna for the purpose of compensating for the effects of temperature on the device is not ideal in that the power desired to provide a large enough signal through two such sets of loosely coupled inductors may heat the windings that constitute the antenna and so complicate the measurement of the true temperature of the coil and the surrounding apparatus. Unlike the present invention, the coil winding that excites the Kreit invention is not used to detect position based on the detection of any variation in its magnetic physics. Unlike the present invention there is no need to prevent any circuit that measures temperature using that winding from affecting the circuit parameters that indicate position in that winding. The position in Kreti's invention is determined by how the excitation produced by the so called "antenna" is ultimately coupled to a separate and independent receive winding. It is the level of excitation present in that receive winding that is measured and related to position and not the measurement of any magnetic field effect in the antenna winding that it uses for temperature measurement. In contrast, the apparatus according to this invention is distinguished in that the temperature measurement it develops uses the very same inductor coil windings that indicate position. This invention is also distinguished in that it includes an electric field and RFI shield and is able to correct for any temperature variation caused by the dielectric material used to insulate that shield from its position sensitive winding. Last, but not least, the present invention can be applied to only one coil winding with only two electrical connections in contrast to the Kreit device which, at minimum, requires three electrical connections.

David Nyce's patent filing, U.S. Pat. No. 7,216,054, like the art taught by Ellis also describes a position sensor using inductive coil principles. Unlike Ellis or this current disclosure, Nyce's construction techniques produced what he termed a "slow wave structure". Unlike the type of device described here, Nyce disclosed a device known to microwave art design practice know as a, "slow wave structure". Such structures are developed to maximize both distributed inductance and distributed capacitance to realize microwave circuits in smaller physical spaces. The patent therefore describes a conventional two layer winding to increase the inductance of the sensor, and flat conductors wound concentrically to increase distributed capacitance. While the inductance of the construction is increased on account of the two winding layers of winding, which is useful in reducing the frequency of operation of the sensor, Nyce's effort to increase capacitance is not desirable in that larger conductor surface areas inherent in flat conductors increase the coupling of stray electric field interference and introduce larger temperature sensitivity factors related to the dielectric materials used to insulate the winding layers from each other and from other effects of the sensor's surroundings. In any case, unlike the sensor described according to the invention described here, Nyce did not describe any type of electric field shield in connection with his apparatus. Too be sure, Nyce's device could benefit from the application of this invention more than most linear sensors because of the enhanced sensitivity of his device to electric fields attributable to his use of flat conductors having a larger surface area over which to accumulate charge and develop larger capacitance. The present invention is also distinguished by the use of the same sensor winding to measure the temperature of the sensor and so accurately correct for any temperature sensitivities.

OBJECTIVES OF THE INVENTION

The objective of this invention is to provide for the improved performance of non-contacting inductive magnetic field based position sensors when subject to high frequency electric field coupled effects.

Another objective is to provide for such immunity to high frequency electric field effects in a manner that does not compromise the accuracy, resolution, and monotonicity of the position function of such sensors. For example, in some applications, the moving target is fashioned out of the moving parts of mechanical systems that inevitably have some conductivity back to the same potentials used by the electronic circuits that measure the sensor and determine the position of the moving target. In such instances the alternating currents conducted are subject to impedance variations of many kinds, from the changing inductive effects of moving current paths to unpredictable impedance variations due to moving joints and bearings. This present invention avoids the coupling of these changing and unpredictable variations to the sensor and so avoids any affect they might have on the precision and repeatability of the sensor.

Another objective is to provide for the improved performance of such non-contacting position sensors with such electric field shields with reduced sensitivity to the effects of the insulating materials used in the construction of the device along with other temperature sensitivities inherent in such non-contacting position sensors.

Another objective is to provide for the more accurate measurement of the temperature of those parts of the sensor that are responsible for such temperature sensitivity so that the compensations derived therefrom correspond more directly and instantaneously with the causes of such temperature sensitivities including the temperature effects of the capacitance related to the dielectric used to insulate the sensor shield if a shield is present.

Yet another objective of this invention is to simultaneously provide for the measurement of the temperature of the sensor coil in addition to the position of the moving part using the same sensor coil winding without the temperature measurement circuit affecting the accuracy of the position measurement.

Still another objective is to provide for thermal conductivity in the region of the sensor element so that the temperature of parts subject to temperature effects can be more rapidly relayed to and more accurately reflected in the temperature indicated by the temperature sensor element used to provide temperature compensation of the sensor's readings.

Another objective of this invention is provide for all of the above mentioned benefits using only two connections to the sensor element in the case of a single ended sensor. This is an especially important benefit when the sensor is required to perform in a high pressure environment such as in a hydraulic cylinder where the terminals required to make electrical connections to and from the pressurized environment are very expensive.

These in addition to other benefits result from the invention disclosed herein.

SUMMARY OF THE INVENTION

A conductive shield element, electrically connected to the electrical ground of the sensor demodulation circuit, is introduced between the inductive sensor and the moving target. This shield is introduced to intercept and drain the space around it of any extraneous electric field energy before it can affect the demodulation circuit.

According to this invention the conductive shield is constructed without a significant conductive pathway perpendicular to the magnetic field components whose variations as a function of position are detected and developed into a measurement of the displacement and motion of the moving element.

In the case of a linear inductive position sensor constructed from wire wound around a coil form along the direction of the position measurement as shown in FIG. 1, A shield according to this invention would be constructed with a series of insulated longitudinal wires or conductive strips insulated from each other running lengthwise in the direction of the position measurement and shown in FIG. 2. A single strip that encircles the whole coil and that does not connect to itself radially would also implement this invention. Such a construction is shown in FIG. 3. Moreover, a single strip that encircles the whole coil form and that overlaps itself radially would also implement this invention provided that the strip is insulated from itself with suitable electrical isolation. All the aforementioned strips prevent the flow of any current perpendicular to the dominant magnetic field of the sensor and are therefore not able to draw any significant energy from the magnetic field developed by the sensor nor is there any flow that would counteract and affect the magnetic field developed by the sensor coil windings in any significant way. In addition, all these configurations of strips are parallel with the measurement axis of the sensor a so do not present any of the non-linearity radial strips would create in the way of variations in extraneous capacitance between the moving element and the sensor.

The device is further improved when the strip, strips, or longitudinal wires are connected to a low impedance point in the electronic sensor circuit used to demodulate the changes in sensor inductance. When so connected these shields will serve to drain any possible electrical currents due to capacitive coupling away from the inductive sensor coil wires and the electric circuits to which they are connected, to a low impedance circuit node that would not be significantly affected by such currents. The circuit ground reference potential is usually the best node for that connection, although the low impedance of a driver output or a circuit power supply terminal would also suffice.

By virtue of the unique arrangement of this shield in the form of a linear strip or strips the shield itself will exhibit a minimum self inductance effect and therefore a minimum self resonance effect. This is important because any self inductance in the shield could interact with the capacitance between the shield and the sensor windings and develop a position dependent resonance that would otherwise interfere with the differential linearity of the sensor position function. With physical uniformity in the direction of detected motion there is no possible non-linearity in the position function that might result from any coupling variation between the shield, the inductive sensor windings, and the moving part whose position is measured.

In the special case of a planar proximity sensor such as that illustrated in FIG. 6, the arrangement and shape of the shield elements would not significantly create any differential non-linearities in the position function as function of the position of the moving part as a function of the perpendicular distance between the plane of the sensor and the plane of the moving target, but could be sensitive to any changes in radial alignment of that motion with the center of the sensor.

In order to be sure that no significant non-linearities due to motion other than in the axis of the desired measurement are created by capacitance coupling changes the shield should be constructed with conductive strips insulated from each other and extending radially from the center of the coil. FIGS. 7 and 8 illustrate two patterns that implement a shield for such a proximity sensor that reduces the sensitivity to motions not in the direction of the device's position measurement range.

Such shields are also useful in connection with other types of position sensors fabricated with planar coils. For example, this invention can apply to rotary position sensors constructed out of planar coils such as illustrated in FIG. 9. This sensor is able to develop a change in the inductance of the winding between inductor connections 17 and 18 as a function of the rotary position of moving part 19. Strips of conductor to implement an electric field shield according to this invention may be arrayed with individually insulating planar strips which follow the same radial path that the sensor conductors do as shown in FIG. 10. These shield strips are connected together at one side only to constitute a shield contact at 20.

This construction has particular novelty in connection with electronic circuits that principally measure the variation in total reactance of a sensor whose self inductance is determined by the position of a moving part. With this invention, any capacitive effects coupled to the sensor that would otherwise alter the reactive impedance of the sensor and which could be a source for linearity errors and temperature sensitivies are diverted away from the sensor circuit and so do not interfere with the relationship between the position being sensed, the sensor inductance, and the resulting indication of position by such electronic circuits.

Any of these shields may be disposed on either or both sides of planar sensors or on either the inside, outside or both the inside and outside of linear sensors to provide for the shielding effect benefits as may accrue to such placement.

Sensors with coils constructed with multiple winding layers can be further improved by the connection of this shield to one of the winding layers in preference to the other. Sensors with coils constructed with multiple winding layers can benefit from reduced capacitance between the shield and the coil winding layers by connecting the ground impedance node of the sensor electronics input to the inductor coil winding lead that starts the winding layer closest to the shield. In this way the electric potential with respect to that low impedance circuit point will be largest on layers that are farthest from the shield and therefore subject to a smaller capacitance between winding and shield because of the larger distance. By connecting the shield this way the capacitance between the shield and all the sensor windings are minimized as would any effects of this capacitance on the sensor operation. Because the resonant capacitance of the sensor is reduced this way the sensor can be operated at a higher resonant frequency and so provide signals with faster response times.

This invention can also be applied to a single layer sensor or to a sensor with an odd number of winding layers where the shield can function as a return wire that provides conductivity from the end of the only or the last winding layer of the sensor back to the same end of the sensor where the sensor winding started.

The shield connection and the return wire of the sensor can therefore be combined and the shield connection provided by simply laying the shield along with the return wire with electrical contact between them along the pathway of the return wire. This provides economy in manufacture in that a sensor coil can be fabricated with a shorter length of wire or the contact between the shield and the wire can be reliably established by contact forces alone between one end of the sensor and the other to reduce the number of solder connections required to implement the device.

This shield is also useful in conducting thermal changes throughout the sensor probe area to facilitate the thermal conductivity of the temperature in the region of the conductive moving target to the sensor assembly where a temperature sensor may be incorporated.

This invention may also be applied to a planar proximity sensor. In the case of a planar proximity sensor this invention may be implemented with strips, wires, or planar conductors extending radially from the center of the planar winding or by such conductors arranged parallel to one another that extend beyond the reach of the magnetic field of the inductor Other configurations of strips or conductors according to this invention will occur to those skilled in the art.

Unfortunately, the construction of a sensor according to this invention substantially increases the capacitance between the electronics ground and the sensor. The sensor shield is one side of that capacitor while the sensor's inductance windings are the other side. Use of circular wire as opposed to flat wire, contrary to what is taught in the Nyce patent, will minimize this capacitance. This capacitance is nevertheless subject to variations in temperature that will interfere with the precision indication of position as the sensor capacitance will alter the resonant frequency of such a sensor configured to develop an oscillation period that varies as a function of the measurement position.

An improved inductive, non-contacting position sensor that substantially reduces any electric field effect between the sensor's stationary and moving parts that would otherwise affect the performance of the sensor. In addition, this invention also reduces the susceptibility of the sensor to electric fields and to radio frequency electro-magnetic fields. The invention also reduces any interference radiation due to electric fields and to radio frequency electro-magnetic fields the sensor might generate.

This construction is particularly effective in eliminating the effect of any variation in electric fields as a function of the position of the sensor target that would otherwise conduct into the windings of the inductive sensor and effect the impedance characteristics of the sensor and that would otherwise effect the position sensor measurements and relationship to the position of the target.

When said shield is connected to at least a local alternating current ground potential, the alternating magnetic field coupling between the sensor and its target is not affected, while any alternating electric field between the target and the sensor can be diverted to the local system alternating current ground potential before it can have any affect on the position sensor and its associated electronic circuits. The shield need not be connected to ground, but any potential having a low high frequency impedance and which would not be affected negatively or negatively affect the sensor due to the capacitive coupling between the shield and the inductive sensor winding.

Because the capacitance between this shield and the coil winding exacerbate the temperature sensitivity of the position sensor a method to more accurately measure the temperature of the sensor, this shield, and the material used to insulate the sensor coil, further improves this position sensor.

The thermal coupling of the shield, which is itself a thermally conductive material such as copper or aluminum, may be connected to a temperature sensing element to measure the temperature of all the sensor parts. This measurement can then be used to compensate for all such temperature effects to further improve the performance of the sensor. The use of the sensor's own windings to measure the temperature of the sensor everywhere that temperature effects the sensor has been found to be a particular effective way to compensate for such temperature effects provided the sensor oscillator circuit is not affected by the measurement. With a sensor inductance measurement circuit that is practically insensitive to variations in the impedance of the temperature measurement, a sensor inductance measurement can be carried continuously without any interruption. A temperature sensitive resistor and a parallel bypass capacitor can be installed in series with the sensor coil at the end of the sensor and may be connected thermally to the sensor shield to provide for temperature measurement with lower DC current requirements while still using only two electrical connections to the sensor probe. Whether a temperature sensitive resistor, a silicon temperature sensor, or the coil winding itself is used as a temperature sensor, temperature sensing requires the delivery of electrical current to the sensing element without significantly effecting the impedance characteristics of the sensor used to detect position using the very same set of wires.

Temperature is measured by supplying a DC current to the sensor but with a direct current current source having a high resistive impedance with respect to the frequencies required to excite the inductive sensor. That current then creates a voltage drop in the sensor winding circuit which is a known function of temperature. For copper, for example, the voltage drop, although small, is more than linear enough for temperature compensation purposes. A low pass filters is used to reject the position sensing frequencies of the excitation leaving only the DC potential that related to temperature. That is then amplified and offset to a level that is easily read with the full resolution available in the circuit's logic, control and demodulation circuits.

Transistors such as bipolar or MOS analog switch transistors can be used to time multiplex the measurement of the sensor's inductance for the temperature position information and the measurement of the DC resistance of the sensor's inductance coil to deduce temperature of the entire sensor and all its parts. Although such a technique can be easily applied to a single ended sensor, such a time multiplexing technique is favored in combination with a differentially configured pair of sensors where each differential sensor inductor is alternately connected to an inductance measurement circuit as in the circuit developed by this inventor and disclosed in his U.S. Pat. No. 4,663,589.

A position sensor based on a single inductor operated at high frequencies in resonance with parallel capacitance to develop an oscillation period that is continuously indicating position simultaneously with the continuous measurement of the temperature of the inductor's DC impedance is accomplished with a novel oscillator configuration criteria. The oscillator used in this invention must be compatible with the measurement of sensor coil DC resistance which is best done with an oscillator that is able to function with one end of the resonant tank circuit connected to ground. Moreover, the oscillator must also be insensitive to the high frequency loss impedance of the temperature measurement circuit in addition to any sensitivity to the variation of the loss impedance of the sensor at high frequencies. Such an oscillator with such insensitivity is accomplished with an insertion of a capacitive coupling at its input that develops the optimum amount of phase lead to compensate for the phase lag of the gain stage that drives the oscillator. Such a design specification will yield an oscillator that will essentially drive the resonant circuit with a current driving function that is in a nearly zero phase relationship with the voltage of the resonant circuit tank. The effect of the oscillator components on the frequency of oscillation will therefore cancel and the oscillator itself will impart only resistive losses to the resonant circuit tank leaving the frequency of resonance unaltered. Under these conditions the frequency generated will be substantially unrelated to the loss impedance of the tank which does vary substantially as a function of temperature because of variations in the sensor physics and because of variations in the circuits used to deliver DC current necessary to measure the DC resistance of the coil winding. To the extent that any oscillator operates at any phase relationship other than zero, that phase relationship would transform these temperature sensitive circuit loss impedances into signals with reactive parts which would alter the frequency of oscillation according to their temperature sensitivities.

The combination of time multiplexing two differentially configured sensor coils at a rate proportional to each oscillator's period as described in patent no. by this inventor in combination which such a zero phase oscillator provides for yet additional precision and position sensor accuracy. The further addition of compatible coil DC impedance measurement to determine the temperature of both sensors in an alternating sequence out of phase with in an array of sensor to further compensate for temperature effects and provide for additional temperature insensitivity and position measurement accuracy than such a circuit system is ordinarily able to provide.

DESCRIPTION OF THE DRAWINGS

FIG. 5 illustrates a shield composed of a single conductive element wrapped around the sensor having an insulating seam which runs the length of the sensor that prevents the circulation of eddy currents around the axis of the sensor that would otherwise compromise the magnetic field distribution of the inductive coil sensor and destroy the relationship between the moving part position and the inductive sensor characteristics. Although not show, the shield itself could wrap around the inductor coil completely provided that there is electrical insulation between any overlapping region of the wrap.

FIG. 11 shows the case where the connection of the shield is made to the coil layer furthest from the shield as the ground reference for the sensor coil. FIG. 12 shows the alternative connection where the coil layer closest to the shield is connected to the shield to constitute the ground reference for the sensor. The FIG. 11 diagram shows how the capacitance between the closest winding and the shield is fully engaged in the electronic characteristics of the sensor when coil connection 4 provides the ungrounded sensor connection. In that instance the entire voltage that appears between contacts 4 and 3 of the sensor is applied to the shield to coil capacitance 24. Alternatively, FIG. 12 shows how that same element of capacitance between the shield and the closest coil winding to the shield is shorted out and is subject to no signal voltage at all when that coil and the shield connection are the ground reference terminal. Since all such elemental capacitances for corresponding regions of the coil further away are substantially smaller than those to the closer winding layer, they contribute much less to the overall capacitance, leaving a substantial disparity between the shield capacitance in the FIG. 11 as compared to the FIG. 12 configuration. Surprisingly large improvements in capacitance between the shield and the coil windings resulting from the FIG. 12 configuration as compared to the FIG. 11 configuration have been demonstrated. When such capacitances are minimized with the configuration illustrated in FIG. 12 the sensor is improved compared to the alternative configuration as the temperature sensitivity any such extraneous capacitance might contribute is improved in proportion to the reduction in such capacitance.

FIG. 15 shows the timing diagram of all the multiplex control switch signals as a function of the oscillator output signal 34, which is labeled as sig-34 in that timing diagram. That frequency or period is a function of which sensor is selected, sensor inductor 37 or 38, as each one is selected by switch control 43 (ctl-43) or control 44 (ctl-44) respectively. For example, the control for switch 43 is labeled ctl-43 and the control for switch 44 is labeled ctl-44. When ctl-44 is off and ctl-43 is on inductor 37 is selected and produces the corresponding timing diagram period labeled T1 after a settling time labeled Tg2-1, 9 oscillator periods are counted before switching the sensors. After ctl-44 and ctl-43 signals are reversed and inductor 38 is selected instead, a period labeled T2 is developed which corresponds to 9 oscillator periods after a one half period settling time Tg1-2 with inductor 38 connected. In addition to proving control signals to avoid switching transients, these time periods may also be used to measure the position periods of each sensor or to develop a ratio-metric differential PWM as taught in U.S. Pat. No. 4,841,245. Other periods comprised of other numbers of oscillator cycle periods or based on a microprocessor oscillators instead are also possible and would naturally occur to those skilled in the art once apprised of this disclosure. Such multiplex switches could also be used in connection with a single ended sensor whereas the measurement of position is multiplexed in timed alternating sequence with the measurement of temperature so that neither measurement need interfere with the other in any way as neither measurement would be made at the same time.

The circuit described in relation to a pair of differential related sensor pairs may be extended to larger arrays of more than two sensors to achieve larger measurement ranges or higher resolution for the same measurement range in a manner that would be obvious to someone of ordinary skill in the art having the advantage of this disclosure.

FIG. 16 shows an oscillator that can provide a zero phase oscillator drive to a resonant circuit tank by the judicious selection of capacitor 52a. FIG. 16 also shows an oscillator where one end of the sensor is connected to a circuit ground that is compatible in the most cost effective way with a ground reference based measurement of the sensor DC resistance from which to derive a temperature measurement.

FIG. 17 shows the preferred current source circuit for delivering a reference current to the sensor coil that results in a DC voltage across the sensor coil that is proportional to the DC resistance of the sensor coil and from which the temperature of the sensor may be deduced.

By the use of a bipolar transistor 79 designed for high frequency applications and which consequently has minimal collector to base and collector to emitter capacitance, and by the shunting effect of capacitor 81 chosen to have a very low reactive impedance at the frequency of operation, very little of the excitation used to measure position and present at the collector of this transistor will be coupled to the base of the transistor.

As a result there will be little if any modulation of the DC collector current as a function of the excitation the collector of this transistor is subject to. As a result, this transistor will be able to accurately deliver DC current to the sensor inductor for the purpose of measuring the DC resistance of the sensor without significantly introducing any temperature sensitivity or noise due to the action of the gain characteristics of the transistor amplifying some rendition of the high frequency collector potential that transistor is subject to. Thus the circuit shown in FIG. 17 avoids compromising the precision, temperature insensitivity, and low noise of the sensor position measurement that can be provided by this invention while providing the DC current necessary to accurately measure the DC resistance of the sensor.

Figure 13:
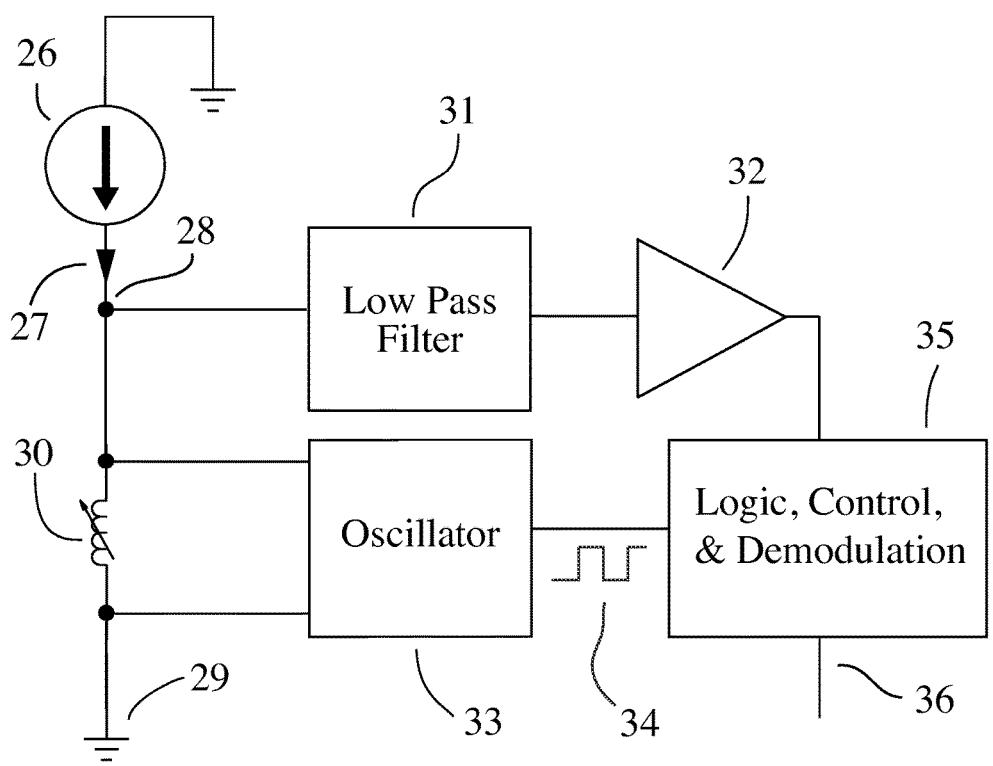
FIG. 13 shows a block diagram of a system that implements all features of this invention appropriate for a single ended sensor having only two connections as show by variable inductor 30. This illustration also represents the preferred embodiment of this invention as the single ended sensor is the preferred sensor configuration.
Figure 14:
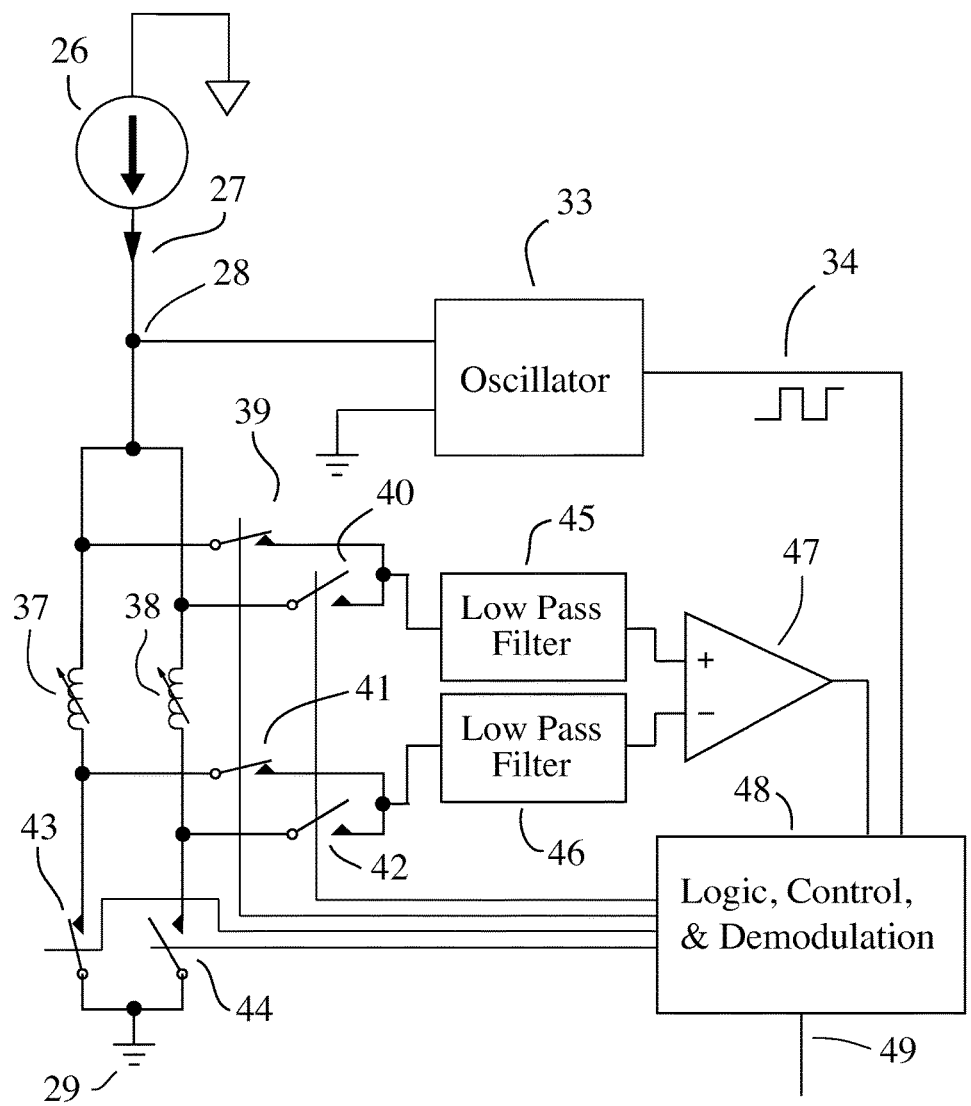
FIG. 14 and FIG. 15. illustrate how this invention may be applied to a pair of differentially arranged inductance sensors in timed alternating sequence such as that described in U.S. Pat. No. 4,841,245 to this inventor. The FIG. 14 circuit may utilize the very same oscillator and current source referred to in FIG. 13 and so are identically labeled 26 and 33. It can also utilize the same low pass filters, shown as circuit blocks 45 and 46, and which is illustrated in FIG. 18, but two of them are required. Two are required to provide inputs to the two inputs of a differential amplifier or a instrumentation amplifier because the voltage drop of the sensor multiplex switches 43 and 44 offset the true measurement of the DC voltages across each sensor resulting from the DC current provided by current source 26 which relates to the temperature of each sensor inductor so a second analog signal channel is necessary to develop the DC voltage difference accurately. Since the sensors themselves are connected to the circuit in timed alternating sequence, measurement f the DC voltage drop related to the temperature of the sensors must also be sampled in timed alternating sequence. The settling time, however, of these multiplexed temperature signals requires special timing to avoid delivering abhorrent transient signals to the low pass filters. The application of guard times, as labeled by the varios Tg's in the timing diagrams, avoids any processing until necessary settling times have been observed. Such timing relationships that would avoid such abhorrent transients while sampling the oscillator in a timed alternating sequence according to U.S. Pat. No. 4,841,245 are shown in FIG. 15.
Figure 15:
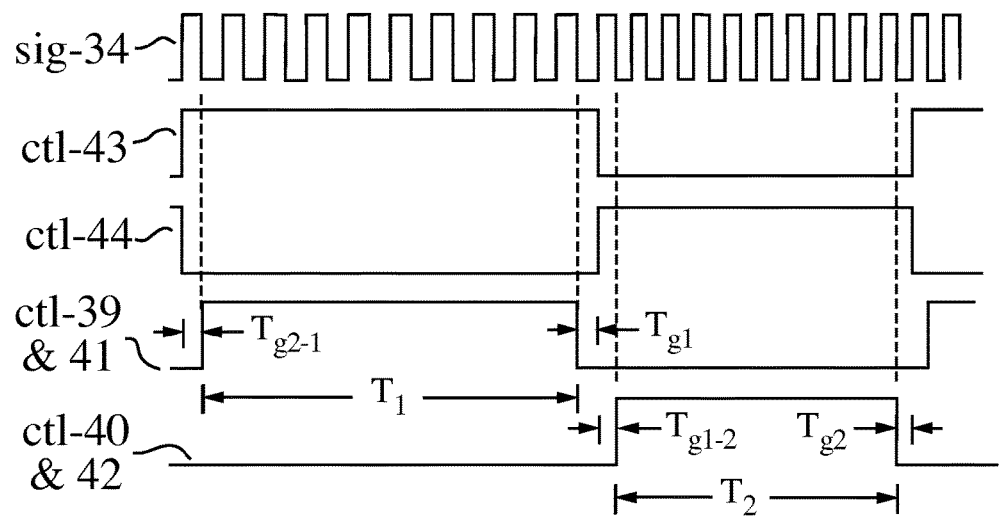

FIG. 18 shows the preferred embodiment of the low pass filter block 31 in FIG. 13 and blocks 45 and 46 in FIG. 14. It is a simple two stage, two pole, passive RC filter. At high frequencies its input impedance is essentially that of resistor 87. At very low frequencies it is designed to pass only the DC voltage at its input node 28, but delivers that voltage with an output impedance equal to the sum of resistors 87 and 88.

THE PREFERRED EMBODIMENT

The preferred embodiment of this invention is applied to a single ended linear position sensor because that is the type of sensor most improved by this invention. This type of sensor is often used for relatively large position measurements which require a long sensor. These linear sensors are particularly susceptible to radio frequency interference especially for frequencies of radio frequency interference (RFI) that are able to couple to the coil winding because of its length. The length of the sensor also makes it difficult and expensive to enclose the whole length of the sensor in an RFI shielding enclosure. Such a solution is also impractical because of the increased diameter necessary and the weight of such an enclosure.

The substantial enhancement in practical performance because of the large reduction in RFI without a shielding enclosure and improvement in temperature compensation this shield invention provides without any compromise in diameter, weight, or the need for any enclosure over the entire length of the sensor, especially for a sensor with long dimensions, makes it clear that the embodiment of this invention in such linear sensors are the most preferred.

Such linear sensors are typically single ended to provide practical stroke to length ratios. A differential sensor would result in sensors at least twice in length which would be impractical in most long stroke sensors. As a result the preferred sensor is singled ended, and the preferred electronics demodulator for such a preferred embodiment is the single ended inductive resonant circuit system illustrated in FIG. 13. The preferred oscillator for block 33 and preferred current source for block 26 in FIG. 13 are applicable and are illustrated completely in FIGS. 16 and 17 respectively.

DETAILED DESCRIPTION OF THE PREFERRED EMBODIMENTS

Figure 1:
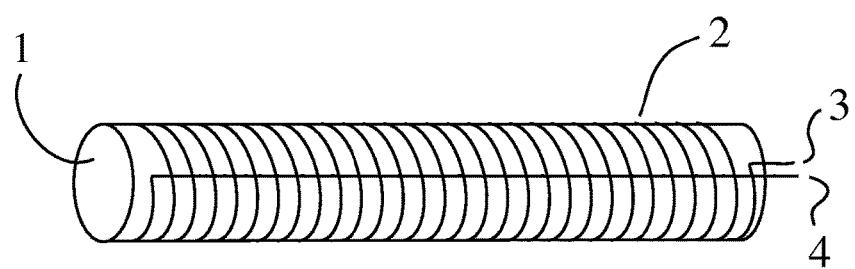
FIG. 1 illustrates a linear inductive position sensor composed of a single layer winding wound on coil form 1 with connections 3 and 4 which is typical of the type of position sensor that can be improved by this invention.
Figure 2:
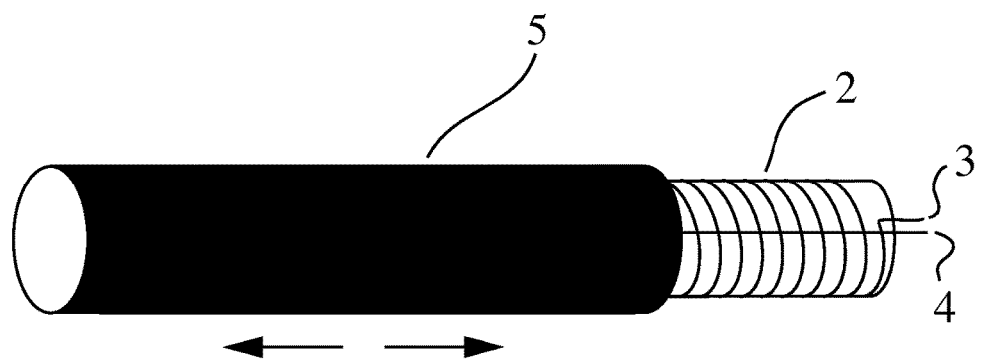
FIG. 2 shows the same single layer inductive sensor shown together with a moving cylindrical element that would cause a change in the inductance of the sensor as a function of the position of the cylindrical moving element. This moving element may be composed of any conducting material such as aluminum, or steel, or alloys of such materials, or alternatively, material having permeability significantly greater than 1 at the frequency of operation. Such a linear sensor could also function similarly with a rod comprised of the same range of materials but that moves inside a hollow of the coil form instead of outside the coil form as it as shown in the illustration, and which also moves along the axis of the sensor coil winding in the same direction as the illustrated moving part. Moving elements that both move inside and outside together are also possible although not illustrated.
Figure 3:
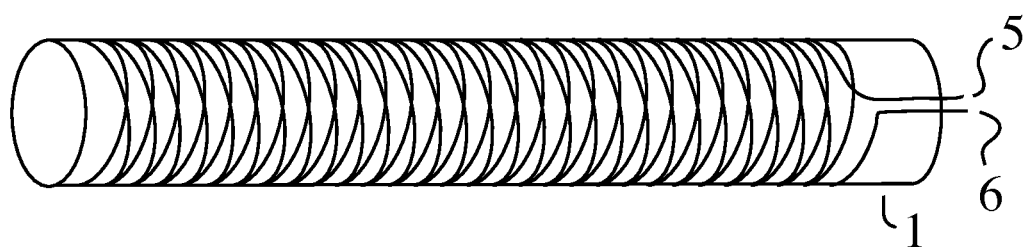
FIG. 3 illustrates a linear inductive position sensor composed of two winding layers with the outgoing conductor 5 wound first and the return winding 6 wound over outgoing conductor 5 on its way back to the starting point of the winding to create a simple two layer coil on coil form 1.
Figure 4:
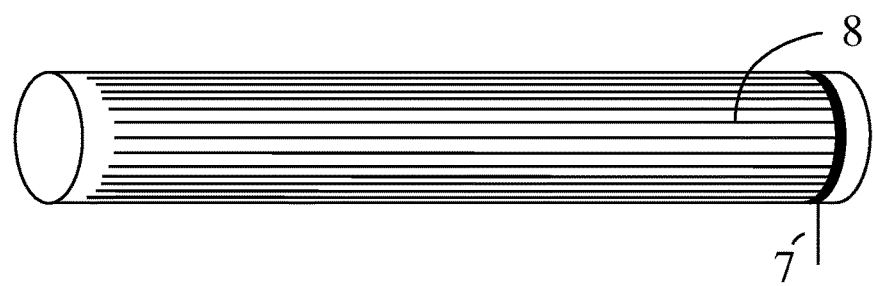
FIG. 4 illustrates an electric field shield for a linear inductive position sensor composed of a radial array of shield elements spaced from each other and arrayed along the direction of motion. This shield would be laid over and around the sensor inductive coil winding and would be electrically isolated from the sensor inductive coil winding. The elements of this array are radially separated and electrically insulated from each other along the axis of the sensor to prevent the circulation of eddy currents around the axis of the sensor that would otherwise compromise the magnetic field. In this way electric fields and radio frequency fields are suppressed without significantly altering the inductive physics of the sensor and without destroying the relationship between the moving part position and the inductive sensor characteristics. The elements are all either electrically connected at one end and to shield connection 7 far enough away from any effective sensor winding or are connected together into two groups which are then connected only at one point to shield connection 7 to avoid any significant flow of eddy currents around the axis of the device at that position.
Figure 5:
FIG. 5 illustrates an electric field shield with connection point 7 for a linear inductive position sensor comprised of a single shield element in preference to multiple shield elements as shown in FIG. 4. Instead of multiple shield elements arranged longitudinally as in FIG. 4 this
Figure 6:
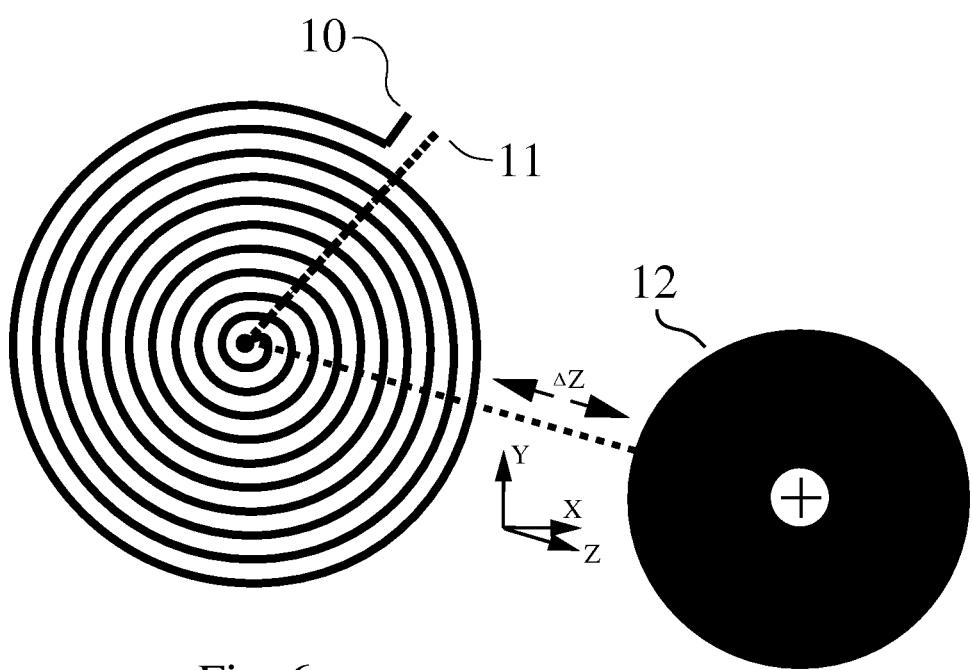
FIG. 6 illustrates a single layer planar proximity sensor inductor coil with connections 10 and 11 for sensing a moving element that is also planar and parallel to the plane of the planar inductive coil windings. The moving element 12 in this instance moves coaxially with the planar coil winding and perpendicular to the plane of the planar coil winding whereas its effect decreases as its distance to the inductive coil sensor increases.
Figure 7:
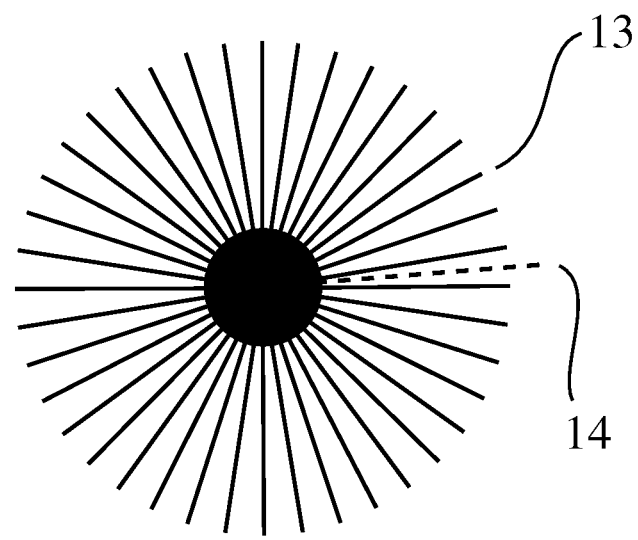
FIG. 7 illustrates a shield constructed according to this invention for use with the planar proximity sensor illustrated in FIG. 6 whereas the shield elements are arranged so that the capacitance coupling between the moving part and the shield is not sensitive to extraneous motions not coaxial and not in the direction of the position measurement. Any residual capacitive effect in the sensor impedance resulting from any radial motion perpendicular to the coaxial measurement direction is minimized on account of the radial symmetry of the placement of the shield elements. Contact to this shield can be made at any of the shield elements or at a point on any shield feature as all sections of the shield are electrically connected.
Figure 8:
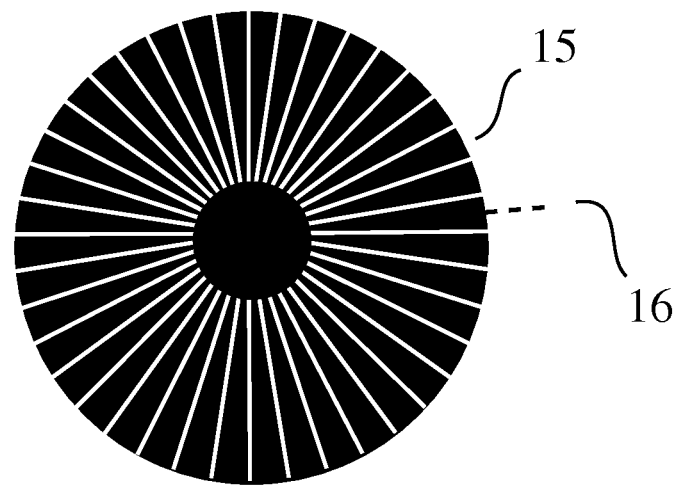
FIG. 8 illustrates a shield with shield elements arranged in the same manner and with the same benefits as the shield illustrated in FIG. 8 but with shield elements whose width is for the most part a linear function of distance from the center of the shield. This shield element design maximizes shield area coverage as the insulating spaces between the shield elements is minimized and so provides improved electric and RF shield performance. Like the design in FIG. 7, electrical connection to this shield may be made at any point on any of the shield's conductive features since all parts of this shield are all electrically connected together.
Figure 9:
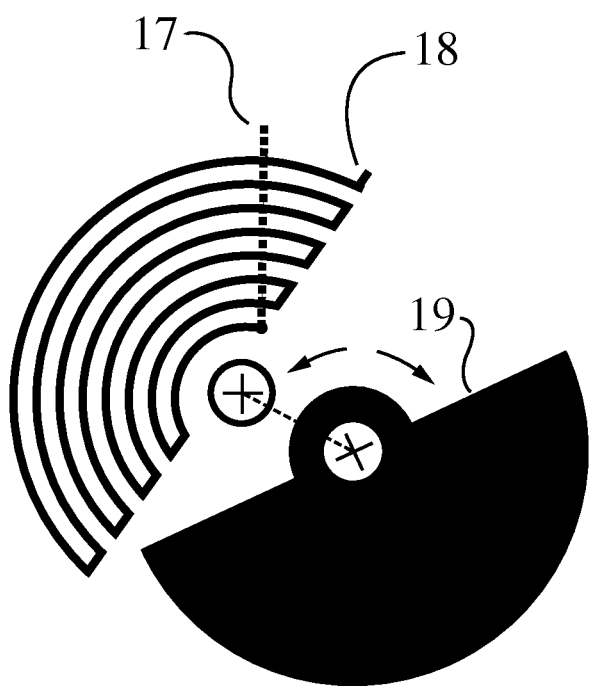
FIG. 9 illustrates a single layer planar rotary position sensor inductor coil between connections 15 and 16 designed to respond to a moving element 17 whereas the rotary motion of the moving element 5 revolves around the same center as the radius of curvature the inductor coil windings follow. This is identical in basic structure to the planar rotary sensor design first described by this inventor in U.S. Pat. No. 4,658,153. It may also be extended to multiple sensors in differential configuration according to the designs disclosed by this inventor in his U.S. Pat. No. 4,663,589.
Figure 10:
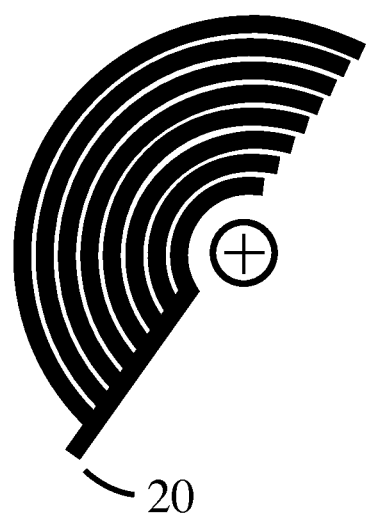
FIG. 10 illustrates an electric field shield with connection 20 designed to provide effective electric field shielding without compromising the linearity of the position sensor illustrated in FIG. 9. This works because there would be no non-linear variation in capacitance coupled to the moving part as a function of rotary angle as the circular shield elements follow the same radial path as corresponding points on the edge of the moving part of the rotary sensor as it follows a circle based on the same center. 1
Figure 11:
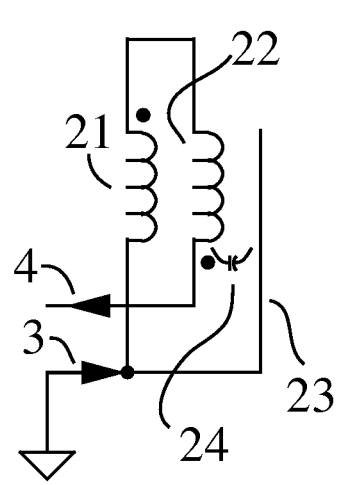
FIGS. 11 and 12 are schematic representation of a lumped circuit model of how a two layer inductive coil sensor is electronically related to the shield element in the two possible connections between the sensor leads and the shield element. These models could represent a two layer linear coil wound on a coil form with circular cross section as illustrated in FIG. 3, or could represent a pair of planar coils laid out on two separate layers of a planar sensor.
Figure 12:
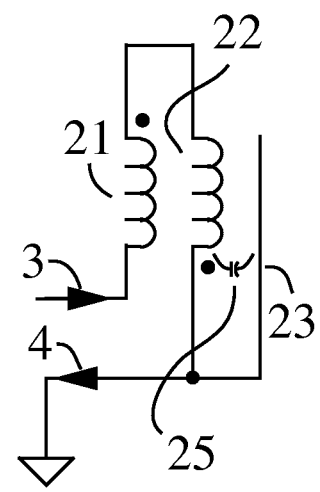

The preferred embodiment of this invention is based on a single layer linear inductive coil winding which can be manufactured at low cost. With a shield of the type illustrated in FIG. 5, and using the shield conductor as the return conductor to save the cost of the extra length of conductor and avoid a radial protuberance that would reduce the clearance between the sensor and a moving cylindrical target moving outside the sensor coil such as illustrated by element 5 in FIG. 2.

Because a single inductive sensor in a single ended configuration is preferred because of the stroke to length requirements are generally unacceptable for long stroke differential linear sensors the singled ended demodulation circuit as illustrated by the FIG. 13 is the best choice.

The FIG. 13 Oscillator circuit block 33 connects to the sensor inductor coil windings 30 to develop an oscillation period that is a repeatable function of the position of the moving part of the position sensor. While many oscillator architectures are possible, such as, for example, those disclosed in U.S. Pat. No. 7,216,054 to this inventor and in U.S. Pat No. to Nyce. The preferred oscillator for this application is detailed in FIG. 16.

The FIG. 16 Oscillator is a modified Collpits design. The Collpits configuration is advantageous in that it requires only one connection to the sensor inductor where the other connection to the sensor is the ground reference of the circuit. This is useful because the circuits that develop a temperature indication from the sensor need not be a differential amplifier because the temperature signal will therefore be ground referenced on account of the ground connection of the sensor coil. The modification of the Collpits is novel and particularly so when used in connection with the measurement of the sensor winding temperature. In this embodiment transistor 54 provides the current gain necessary to overcome the losses in the resonant circuit composed of the sensor inductor connected to node 28 and ground 29 in resonance with the series combination of capacitor 50 and 51 to develop a sustained oscillation. The level of the current drive transistor 54 is able to deliver is regulated by a current delivered by transistor 58 in a circuit designed to provide a constant current with high dynamic impedance to power transistor 54. When properly adjusted the oscillation amplitude is determined by the non-linearity of transistor 54, and when the signal is small enough that non-linearity and its temperature dependency will have little effect on the oscillation frequency or period. There is, however, some delay due to the speed of action of transistor 54 among other circuit effects which result in a phase lag between the voltage at node 28 and the current delivered by the action of transistor 54. Such a phase lag biases the oscillation period away from the natural resonance of the resonant tank formed by the sensor inductance in parallel with the series combination of capacitors 50 and 51. The degree of this period bias is related proportionally to the drive impedance and to the resonant circuit losses, including those introduced by the DC current source and temperature signal filter, and also to the degree of the oscillator's drive impedance phase. It has been found that if the oscillator's drive impedance phase is near zero the frequency or period of oscillation can be very insensitive to changes in the circuit tank loss impedances. Such a condition can be easily achieved in the modified oscillator disclosed here by engineering a phase lead between the oscillator tank signal and the input to the oscillator drive transistor created by the judicious selection of coupling capacitor 52a. With the right value for capacitor 52a in relation to resistors 52b, 53 and the input characteristics of transistor 54, a small phase lag can be developed which cancels the lag inherent in the operation of the oscillator's amplifier transistor 54, leaving the sensor resonant tank to operate at that frequency where the current and voltage phase match which is the exact resonant frequency center of the tank circuit and which is only slightly affected by the magnitude of the tank losses. The oscillator circuit configured with such a zero phase characteristic is particularly useful for a position sensor based on a tank circuit resonance frequency or period. Not only would such an oscillator be insensitive to any losses introduced by circuits such as those required to develop a measurement of temperature via the same connections used to develop the position indicating signals, but would also be insensitive to changes in the high frequency loss impedance of the sensor windings but also to the position dependent losses coupled to the sensor coil from the moving target whose position is being measured.

The Oscillator circuit shown in FIG. 16 also includes a noise filter composed of resistor 55 and capacitor 56 to prevent current variations in the current from the collector of transistor 54 from escaping into the power supply bus and interacting with the high gain and high frequency circuits which follow in undesirable ways. In addition to helping to determine a stable phase lead relationship at the input of transistor 54, resistors 52b and 53 also determine the DC operating point of the oscillator circuit. Resistors 59, 612 and transistors 58 and 62 form a current mirror circuit to mirror the current determined by resistor 63. Resistor 57 is included to decouple transistor 58 from the oscillator circuit at very high frequencies and to reduce the power dissipation of transistor 58 and so minimize its heating. Resistor 55 is also useful for minimizing the heating of transistor 54. Capacitor 60 shunts any stray signal current from the collector of transistor 58 to its base. In this way the stray current, which is primarily due to the collector to base capacitance of transistor 58, is bypassed away from the base to emitter circuit of the transistor where it would otherwise severely decrease the dynamic impedance of the sensor drive circuit which appears in parallel with part of the sensor resonant circuit because it connects to capacitor 51. Transistor 64 implements a source follower type unity gain amplifier to buffer the sensor's resonant tank circuit at a point where its impedance is at a maximum so that variations in the source impedance of the amplifier developed by transistor 64 in connection with resistor 65 will have little, if any, effect on the oscillator circuit. The buffered signal at resistor 65 is then AC coupled to a voltage gain stage designed to develop a signal suitable for clocking the counter inputs of a microprocessor. This voltage gain is provided by transistor 70 whose bias levels are determined by transistor 67, and resistors 68 and 71 in a way that compensates for temperature changes in transistor 70 with the temperature characteristics of transistor 67. This is necessary to provide a large, temperature independent output voltage swing at the collector of transistor 70 which determines output 75. The transistor bias must be very low and track the transistor's base to emitter voltage drop to provide an output that is able to drive very low. This is necessary because the potential at the collector of transistor 70 could never drop below the potential bias at its emitter connection. Transistor 67 is necessary to provide a temperature tracking bias voltage so that the resulting DC operating point of the emitter of transistor 70 can be maintained at a very low voltage, even substantially lower than the change in the voltage drop between base to emitter of the transistor over the full range of operating temperatures. Resistor 72 primarily determines the high frequency gain of the circuit in relation to output load resistor 74 because it connects resistor 72 to the circuit only at high frequencies. In this way the gain of the circuit is determined somewhat independently from the bias point of the output which is determined only by the value of resistor 71 in relation to resistor 74 and the level DC of bias voltage maintained at the emitter of transistor 70. A digital CMOS input compatible signal is therefore provided at oscillator output 75 which is certain to trigger the digital input of any micro-processor used to implement this invention.

The FIG. 13 constant current source circuit 26 delivers a constant current to the sensor inductor in order to measure the DC resistance of the sensor winding circuit. The dynamic output impedance of this current source at the frequencies used to measure position should be designed to be as large as possible. The preferred circuit for developing this constant current source is illustrated in detail in FIG. 17. High dynamic output impedance is achieved by using a bipolar transistor, transistor 79, chosen for a minimum capacitance between its collector and base and between its collector and emitter. The MPSH81 RF transistor is a good choice for this purpose. To achieve the highest dynamic output impedance at high frequencies it is necessary to reduce any reverse coupling from the collector of the transistor to its base. Such reverse coupling is greatly reduced by capacitor 81 which shunts any high frequency voltage at the base of transistor 79 which might find it way to the base of that transistor through the transistor's reverse coupling capacitance. This is especially important because any signal current that finds its way into the base will be amplified by the high current gain of the transistor and so greatly decrease the effective output impedance of the transistor.

The DC current supplied by the current source is regulated by the action of op-amp 83. Resistors 84 and 85 provide a voltage to the positive input (+) of op-Amp 83 whose output determines the voltage on resistor 80 via transistor 79 such that the voltage at the negative (−) input matches the positive (+) input of op-amp 83. Resistor 82 reduces the maximum voltage output op-amp 83 needs to deliver to achieve the voltage level required at the base of transistor 79 to meet that matching condition and so permits op-amp 83 to operate at a point in its output capability that maximizes the gain of the op-amp and so develop the voltage on resistor 80 with greater precision in matching to the voltage on resistor 82. Substantially all of the current required to match the voltage across resistor 80 to that across resistor 84 is provided by transistor 79 and constitutes current 78. Selection of a transistor with high current gain at the current level required is preferred as the matching of current between the emitter circuit and the collector circuit of the transistor will be proportional to the transistor's current gain.

Referring back to FIG. 13, the constant current developed by the FIG. 17 circuit current is delivered to the sensor probe circuit 30 and results in a constant voltage at circuit node 28 that is directly proportional to the DC impedance of probe circuit 30 according to Ohms law. This voltage also includes the signal used to develop a position indication which must be filtered to accurately recover just the temperature information. This filtering is best accomplished with a passive low pass filter as illustrated in FIG. 18. Such a two pole passive low pass filter is necessary when the actual winding resistance of the sensor is being measured because of the very low voltages that result across the sensor from reasonable DC current levels and the need to suppress the high frequency sensor signal that is superimposed on that signal. Such high frequencies would otherwise compromise the precision of the amplification of that DC current level in voltage amplifier 32 of FIG. 13. The filter circuit, however, does present a resistive load to the sensor inductor which could reduce the quality factor of the resonant circuit and increase the phase noise of the oscillation. Accordingly high values of resistor 87 are preferred to minimize such loading. Large values of capacitance for capacitor 89 and 90 are also in order to provide for very high attenuation of the sensor position signal whereas high values of resistors 87 and 88 not only minimize the loading effects on the oscillator but improve the attenuation of the filter as well. One limitation to the values of these components is the ability of the high gain DC amplifier 32 of FIG. 13 to accurately work with the high circuit node impedance these resistors deliver to its input.

Once the constant voltage across the sensor is separated from the voltage at node 28 of FIG. 13 it is then amplified by amplifier 32 and is can then be delivered to the logic, control and demodulation block 35. The signal can also be offset in the gain amplifier circuit in order to develop a temperature indication signal that spans the whole range of voltages block 35 detects in order to take full advantage of all the resolution the block 35 component can offer in the way of incorporating the analog temperature indicating signal into its temperature compensation calculations.

The logic, control and demodulation block 35 can be entirely implemented in a modern single chip micro computer such as a PIC18F26K22 manufactured my Microchip Technology Incorporated. Such micro computer IC's have inputs for measuring analog voltage in addition to digital inputs that can be configured to measure frequency or period and which can be used to develop a position indication. Such devices can be programmed to read the analog voltage representing the temperature measurement and use that value to temperature compensate the frequency or period measured from the signal provided by the sensor oscillator circuit. The micro-computer can then output the position indication in a variety of ways according to the application requirements. The information is typically delivered in a simple digital serial format or in the form of a pulse width modulation, two methods that micro computer IC's are typically able to develop entirely without any additional circuitry.

What is claimed is:

1. A sensor apparatus comprising:
   (a) at least one inductive coil part having at least one conductive inductive winding sensitive to the position of a electrically non-contacting moving part, and
   (b) at least one electrically conductive shield element situated in the vicinity of significant magnetic fields generated by said inductive coil part while in operation and configured in shape to avoid the inducement of any significant currents in such a shield element that would otherwise significantly alter the magnetic field developed by said inductive coil part, and
   (c) an electronic circuit configured to measure electrical parameters of said conductive inductive winding that are at least a function of the position of an electrically non-contacting moving part whereas said electrically conductive shield element is connected to at least one electrical potential utilized by said electronic circuit,
   (d) whereas said electronic circuit develops an oscillation whose period of oscillation is determined by electrical connection to both ends of said at least one conductive inductive winding, and having an electrical output related to the period if oscillation and so responsive of the position of said electrically non-contacting moving part.

2. A sensor apparatus according to claim 1 further comprising:
   (a) at least one inductive coil part having at least one conductive inductive winding wound around and along the axis of motion of an electrically non-contacting moving part, said inductive coil part being sensitive to the position of an electrically non-contacting moving part moving concentrically with said inductive winding, and
   (b) at least one electrically conductive shield element situated on or near said conductive inductive winding and interposed in the space between said electrically non-contacting moving part and said conductive inductive winding, laid along the same axis and along the same path as said inductive coil winding progresses, said electrically conductive shield element consisting of at least one strip laid axially upon and wrapped around or laid inside of said at least one coil winding and insulated from the coil winding conductors and insulated from contacting itself or other such strips anywhere except at one end of the sensor where a shield contact may be established.

3. The Sensor Apparatus according to claim 1, whereas said at least one electrically conductive shield element is a sheet of conductive foil wound concentrically with said conductive inductive windings, said electrically conductive shield element configured with insulation disposed in such a way as to insulate said electrically conductive shield element from said conductive inductive windings and to insulate the shield element from itself should it overlap or otherwise make contact with itself.

4. The Sensor Apparatus according to claim 1 whereas said at least one electrically conductive shield element is composed of at least one strip, insulated or spaced from itself and from any other such conductive strips and from said conductive windings, disposed along the length of said inductive winding and running parallel to the path of said electrically non-contacting moving part, and conforming to the surface shape of said conductive inductive windings or its substrate.

5. The sensor apparatus according to claim 1 having a sensor part comprised of more than one layer of winding separated by insulation whereas the shield element is connected to the conductor that connects that inductive winding disposed closest to the shield.

6. A sensor apparatus according to claim 1 comprising:
   (a) at least one inductive coil part composed of a planar winding conductor disposed on a planar layer of insulating material whose inductance changes as a function of an electrically non-contacting moving part and whose motion is primarily restricted to a plane perpendicular to the inductive coil part, and
   (b) at least one shield element composed of strips of conductor insulated from each other and insulated from said inductive coil part comprised of strips of conducting material which strips radiate from the center of said shield and which connect together only at their center.

7. The sensor apparatus according to claim 1, further comprising a temperature sensitive element whose DC resistance or voltage drop is a function of temperature and which is thermally coupled to said conductive inductive winding and/or said at least one electrically conductive shield element and which DC resistance is used to compensate for the temperature sensitivity of said electrical parameters of said conductive inductive winding.

8. The sensor apparatus according to claim 1, further comprising a temperature sensitive element wired in series with said sensor inductive coil windings and in parallel with a bypass capacitor that bypasses any high frequency currents around such a temperature sensitive element.

9. The sensor apparatus according to claim 1 further comprising
   (a) a constant current source circuit to apply a constant current to at least one of said at least one inductive coil part which current creates a voltage difference between the leads of said at least one inductive coil part in proportion to the DC impedance of the at least one inductive coil part which DC impedance is a function of temperature, and
   (b) an electronic circuit able to detect and measure said voltage difference between said leads, able to operate simultaneously with the measurement of position, and develop a measure of the temperature of at least one part of the sensor.

10. The sensor apparatus according to claim 1, further comprising an oscillator circuit that creates a resonant tank circuit with the inductance of said at least one inductive coil part to create and develop an oscillation with a frequency or period which is a function of position, said oscillator implementing a zero phase impedance driving function.

11. The sensor apparatus according to claim 9, further comprising
   (a) at least one additional conductive inductive winding sensitive to the position of an electrically non-contacting moving part whose DC impedance varies as a function of temperature, and
   (b) a multiplex switch network to alternately connect, in a timed alternating sequence, a DC impedance measuring circuit and a position sensing demodulation circuit to one or more of such position sensing inductors, and
   (c) an electronic circuit that is able to combine the DC impedance measurement with the position measurement in order to correct and compensate the position measurement for any temperature sensitivity the position measurement may be subject to.

12. The sensor apparatus according to claim 1 further comprising an electronic circuit able to detect and measure said voltage difference between the leads of said at least one inductive coil part and able to operate in alternating sequence with the measurement of position, and develop a measure of the temperature of at least one part of the sensor during time periods in which the electronic circuit is not measuring position.

13. The sensor apparatus according to claim 9 further comprising a multiplex switch network to alternately connect, in a timed alternating sequence, one of at least two inductive position sensors to a circuit that simultaneously measures an average of the DC impedance of all the sensors and the position sensitive inductance of each sensor by connecting the sensors with multiplex switches to one inductive position sensor at a time.

14. A Sensor apparatus comprised of
   (a) A position sensor probe that incorporates at least one inductive coil part having at least one conductive inductive winding sensitive to the position of an electrically non-contacting moving part and whose DC resistance is a function of the temperature of at least one part of one of the inductors, and
   (b) a constant current source circuit to apply a constant current to at least one of said sensor inductive coil part which current creates a voltage difference between the leads of at least one part of one of said inductive coil part, and (c) an electronic circuit able to detect and measure said voltage difference between said leads, able to operate simultaneously and through the same connections used for the measurement of position, (d) said constant current source circuit applying a constant current through the output terminal of a transistor in a circuit providing a high dynamic output impedance at the frequency of excitation applied to said inductive sensor such that the effect of such losses so introduced to the sensor circuit do not dominate or overwhelm the effect of losses inherent in the sensor circuit alone.

15. The sensor apparatus according to claim 14 further comprised of an oscillator circuit that creates a resonant tank circuit with the inductance of said inductive position sensor, and that provides a zero phase excitation for developing an oscillation whose period of oscillation is determined by the inductance of said inductive sensor.

16. The sensor apparatus according to claim 14 further comprised of (a) a multiplex switch network to alternately connect, in a timed alternating sequence, a DC impedance measuring circuit and a position sensing demodulation circuit to one or more of such position sensing inductors, and (b) an electronic circuit that is able to combine the DC impedance measurement with the position measurement in order to correct and compensate the position measurement for any temperature sensitivity the position measurement may be subject to.

17. A Sensor apparatus comprised of (a) A position sensor probe that incorporates at least one inductor whose inductance varies as a function of the position of said electrically non-contacting moving part, and (b) an oscillator circuit that creates a resonant tank circuit with the inductance of said inductive position sensor to develop an oscillation with a frequency or period which is a function of position, and (c) said oscillator incorporating a circuit that implements a zero phase impedance driving function.

18. The sensor apparatus according to claim 10 further comprising:

(a) a sensor probe whose DC resistance is a function of the temperature of at least one part of said sensor inductor and (b) a constant current source circuit to apply a constant current to at least one of said sensor inductors which current creates a voltage difference between the leads of at least one part of one of said inductive sensors, and (c) an electronic circuit able to detect and measure said voltage difference between said leads, able to operate simultaneously and through the same connections used for the measurement of position, and (d) said constant current source circuit applying a constant current through the output terminal of a transistor in a circuit providing a high dynamic output impedance at the frequency of excitation applied to said inductive sensor such that the effect of such losses so introduced to the sensor circuit do not dominate or overwhelm the affect of losses inherent in the sensor circuit alone.

19. A sensor apparatus according to claim 1 comprising:

(a) at least one inductive coil part composed of a conductive winding configured whose inductance is configured to respond to changes as a function of an electrically non-contacting moving part whose motion is primarily restricted to a plane parallel to the inductive coil part, (b) at least one shield element composed of strips of conductor, insulated from each other and from said conductive windings, disposed on the plane of a shielding layer which strips follow the same path as may be traced upon such a shield layer according to the path of motion of said electrically non-contacting moving part, and (c) an electronic circuit configured to measure electrical parameters of the sensor that are at least a function of changing inductance of the sensor as a function of an electrically non-contacting moving part whereas said electrically conductive shield element is connected to at least one electrical potential utilized by said electronic circuit.

20. A sensor apparatus comprising:

(a) at least one inductive coil part having at least one conductive inductive winding sensitive to the position of an electrically non-contacting moving part, and (b) at least one electrically conductive shield element situated in the vicinity of significant magnetic fields generated by said inductive coil part while in operation and configured in shape to avoid the inducement of any significant currents in such a shield element that would significantly alter the magnetic field developed by said inductive coil part, and (c) an electronic circuit configured to measure electrical parameters of said conductive inductive winding that are at least a function of the position of an electrically non-contacting moving part whereas said electrically conductive shield element is connected to at least one electrical potential utilized by said electronic circuit, and (d) at least one inductive coil part having at least one conductive inductive winding wound around and along the axis of motion of an electrically non-contacting moving part, said inductive coil part being sensitive to the position of an electrically non-contacting moving part moving concentrically with said inductive winding, and (e) at least one electrically conductive shield element situated on or near said conductive inductive winding and interposed in the space between said electrically non-contacting moving part and said conductive inductive winding, laid along the same axis and along the same path as said inductive coil winding progresses, said electrically conductive shield element consisting of at least one strip laid axially upon and wrapped around or laid inside of said at least one coil winding and insulated from the coil winding conductors and insulated from contacting itself or other such strips anywhere except at one end of the sensor where a shield contact may be established.

21. A sensor apparatus comprising:

(a) at least one inductive coil part having at least one conductive inductive winding sensitive to the position of an electrically non-contacting moving part, and (b) at least one electrically conductive shield element situated in the vicinity of significant magnetic fields generated by said inductive coil part while in operation and configured in shape to avoid the inducement of any significant currents in such a shield element that would significantly alter the magnetic field developed by said inductive coil part, and (c) an electronic circuit configured to measure electrical parameters of said conductive inductive winding that are at least a function of the position of an electrically non-contacting moving part whereas said electrically conductive shield element is connected to at least one electrical potential utilized by said electronic circuit, and (d) at least one inductive coil part composed of a planar winding conductor disposed on a planar layer of insulating material whose inductance changes as a function of an electrically non-contacting moving part and whose motion is primarily restricted to a plane perpendicular to the inductive coil part, and (e) at least one shield element composed of strips of conductor insulated from each other and insulated from said inductive coil part comprised of strips of conducting material which strips radiate from the center of said shield and which connect together only at their center.

22. A sensor apparatus comprising:

(a) at least one inductive coil part having at least one conductive inductive winding sensitive to the position of an electrically non-contacting moving part, and (b) at least one electrically conductive shield element situated in the vicinity of significant magnetic fields generated by said inductive coil part while in operation and configured in shape to avoid the inducement of any significant currents in such a shield element that would significantly alter the magnetic field developed by said inductive coil part, and (c) an electronic circuit configured to measure electrical parameters of said conductive inductive winding that are at least a function of the position of an electrically non-contacting moving part whereas said electrically conductive shield element is connected to at least one electrical potential utilized by said electronic circuit, and (d) at least one inductive coil part composed of a conductive winding whose inductance is configured to respond to changes as a function of an electrically non-contacting moving part whose motion is primarily restricted to a plane parallel to the inductive coil part, (e) at least one shield element composed of strips of conductor, insulated from each other and from said conductive windings, disposed on the plane of a shielding layer which strips follow the same path as may be traced upon such a shield layer according to the path of motion and of said electrically non-contacting moving part, (f) an electronic circuit configured to measure electrical parameters of the sensor that are at least a function of changing inductance of the sensor as a function of an electrically non-contacting moving part whereas said electrically conductive shield element is connected to at least one electrical potential utilized by said electronic circuit.

* * * * *